United States Patent
Han et al.

(10) Patent No.: US 12,155,355 B2
(45) Date of Patent: Nov. 26, 2024

(54) RADIO FREQUENCY CIRCUIT AND ADJUSTABLE TRANSFORMER

(71) Applicant: Huawei Technologies Co., Ltd., Shenzhen (CN)

(72) Inventors: Kefeng Han, Shanghai (CN); Lei Lu, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 464 days.

(21) Appl. No.: 17/487,688

(22) Filed: Sep. 28, 2021

(65) Prior Publication Data

US 2022/0021353 A1 Jan. 20, 2022

Related U.S. Application Data

(63) Continuation of application No. PCT/CN2019/080677, filed on Mar. 29, 2019.

(51) Int. Cl.
*H03F 3/19* (2006.01)
*H04B 1/40* (2015.01)

(52) U.S. Cl.
CPC ............. *H03F 3/19* (2013.01); *H04B 1/40* (2013.01); *H03F 2200/451* (2013.01)

(58) Field of Classification Search
CPC .......... H03F 3/19; H03F 2200/451; H03F 2200/411; H03F 1/42; H03F 2200/537; H04B 1/40; H04B 1/581; H01F 27/2804; H01F 21/12
USPC .......................................... 330/310, 302, 305
See application file for complete search history.

(56) References Cited

U.S. PATENT DOCUMENTS

| | | | |
|---|---|---|---|
| 6,566,963 B1 | 5/2003 | Yan et al. | |
| 8,244,194 B2 * | 8/2012 | Morgan | H03F 3/195 |
| | | | 455/188.1 |
| 9,407,379 B2 * | 8/2016 | Lau | H03D 7/1458 |
| 2014/0070884 A1 | 3/2014 | Gramegna et al. | |
| 2016/0112146 A1 | 4/2016 | Lau et al. | |
| 2016/0276098 A1 | 9/2016 | Xie et al. | |

FOREIGN PATENT DOCUMENTS

| | | |
|---|---|---|
| CN | 101868921 A | 10/2010 |
| CN | 104300992 A | 1/2015 |
| CN | 104733452 A | 6/2015 |
| CN | 108364768 A | 8/2018 |
| CN | 108768312 A | 11/2018 |
| CN | 109474296 A | 3/2019 |

OTHER PUBLICATIONS

Han, K. et al., "A 9.5 18.5 GHZ Power Amplifier for Multi-band Microwave Point-to-Point Backhaul Communication", 2014 IEEE Radio Frequency Integrated Circuits Symposium, Jun. 1-3, 2014, 4 pages.

* cited by examiner

*Primary Examiner* — Hieu P Nguyen
(74) *Attorney, Agent, or Firm* — Slater Matsil, LLP

(57) ABSTRACT

A radio frequency circuit includes an adjustable transformer, a first-stage amplifier, and a second-stage amplifier, the first-stage amplifier is coupled to the second-stage amplifier by using the adjustable transformer, and a bandwidth of the adjustable transformer is adjustable. When the bandwidth of the adjustable transformer is adjusted, an operating frequency band of the radio frequency circuit covers an n258 frequency band and an n257 frequency band, or the n258 frequency band and an n261 frequency band.

20 Claims, 7 Drawing Sheets

RADIO FREQUENCY CIRCUIT AND ADJUSTABLE TRANSFORMER

CROSS-REFERENCE TO RELATED APPLICATIONS

This application is a continuation of International Application No. PCT/CN2019/080677, filed on Mar. 29, 2019, the disclosure of which is hereby incorporated by reference in its entirety.

TECHNICAL FIELD

This application relates to the field of electronic technologies, and in particular, to a radio frequency circuit and an adjustable transformer.

BACKGROUND

At present, a fifth-generation mobile communications (5G) technology applies a frequency band in which frequencies are above 24 GHz (commonly referred to as a millimeter wave) to mobile broadband communications. In comparison with mobile communications technologies such as 4G and 3G, many available high-band spectra are added to 5G, enabling a 5G system to provide extreme data transmission rates and capacities. This reshapes mobile experience. Three new radio (NR) frequency bands are defined in the vicinity of 28 GHz for 5G millimeter wave communications, that is, n257, n258, and n261 frequency bands.

In a conventional radio frequency transceiver, for different frequency bands, an independent receive/transmit link needs to be used to process radio frequency (RF) signals in the different frequency bands. For a 5G radio frequency transceiver, different frequency bands need to be covered to support different modes. Therefore, compared with three frequency bands defined in a 4G communications system, that is, a low frequency band (LB), a middle frequency band (MB), and a high frequency band (HB), each of the NR frequency bands defined in a 5G millimeter wave is corresponding to a bandwidth higher than bandwidths of the LB, the MB, and the HB. In a design of the 5G radio frequency transceiver, if a single link is still used, considering that on-chip device parameters vary with a process, voltage, and temperature (PVT), and the like during chip design, it is more difficult to cover frequency bands with higher bandwidths than the LB, the MB, and the HB. Therefore, a multi-band switching solution is urgently needed for the 5G millimeter wave.

SUMMARY

This application provides a radio frequency circuit and an adjustable transformer, to implement switching between operating frequency bands.

To achieve the foregoing objective, the following technical solutions are used in this application.

According to a first aspect, a radio frequency circuit is provided. The radio frequency circuit is used for receiving or sending performed in a 5G millimeter wave. The radio frequency circuit includes an adjustable transformer, a first-stage amplifier, and a second-stage amplifier, the first-stage amplifier is coupled to the second-stage amplifier by using the adjustable transformer, and a bandwidth of the adjustable transformer is adjustable. When the bandwidth of the adjustable transformer is adjusted, an operating frequency band of the radio frequency circuit covers an n258 frequency band and an n257 frequency band, or the n258 frequency band and an n261 frequency band. In this technical solution, the adjustable transformer in the radio frequency circuit is adjusted, so that the operating frequency band of the radio frequency circuit can cover the n258 frequency band and the n257 frequency band, (that is, switching between the n258 frequency band and the n257 frequency band), or the n258 frequency band and the n261 frequency band (that is, switching between the n258 frequency band and the n261 frequency band). This implements multi-band switching for the 5G millimeter wave.

In a possible implementation of the first aspect, the adjustable transformer includes an adjustable switch, and the adjustable switch is configured to adjust the adjustable transformer. The possible implementation provides a manner of simply and effectively adjusting the adjustable transformer by using the adjustable switch.

In a possible implementation of the first aspect, the adjustable transformer includes a primary coil, a secondary coil, and at least one first coil, the primary coil and the secondary coil are magnetically coupled, the at least one first coil is magnetically coupled to both the primary coil and the secondary coil, two ends of the first coil are respectively coupled to two nodes, and an impedance between the two nodes is adjustable. In the possible implementation, mutual inductance between the first coil, the primary coil, and the secondary coil is changed by adjusting the impedance between the two ends of the first coil. In this way, the adjustable transformer is adjusted, and relatively desirable performance of the radio frequency circuit can be ensured in an adjustment process.

In a possible implementation of the first aspect, a Q value enhancement circuit that forms a loop with the first coil is further disposed between the two nodes, and the Q value enhancement circuit is configured to increase a Q value of the adjustable transformer. In the possible implementation, the Q value enhancement circuit can increase a quality factor of the adjustable transformer, and can reduce a loss of a passive component in the adjustable transformer.

In a possible implementation of the first aspect, the Q value enhancement circuit includes a cross-coupling field effect transistor (FET) pair, configured to provide negative resistance compensation for the first coil. In the possible implementation, the quality factor of the adjustable transformer can be increased.

In a possible implementation of the first aspect, the Q value enhancement circuit further includes a variable current source, configured to provide a current for the cross-coupling FET pair. In the possible implementation, the quality factor of the adjustable transformer can be increased.

In a possible implementation of the first aspect, an adjustable resistor or a switch that forms a loop with the first coil is further disposed between the two nodes. In the possible implementation, the mutual inductance between the first coil, the primary coil, and the secondary coil can be changed by adjusting a status of the switch to different states (for example, an open state and a closed state) or adjusting a resistance of the adjustable resistor. In this way, the adjustable transformer is adjusted, and relatively desirable performance of the radio frequency circuit can be ensured in an adjustment process.

In a possible implementation of the first aspect, the switch is a transistor, and a gate voltage of the transistor is adjustable. In the possible implementation, a manner of implementing the switch by using the transistor is provided, to simplify a circuit design of the adjustable transformer.

In a possible implementation of the first aspect, in a layout structure of the adjustable transformer, the primary coil, the secondary coil, and the at least one first coil are disposed at at least one wiring layer. In the possible implementation, diversity and flexibility of the layout structure of the transformer can be improved.

In a possible implementation of the first aspect, in a layout of the adjustable transformer, the primary coil, the secondary coil, and the at least one first coil are disposed at one wiring layer, and the primary coil and the secondary coil are located on an outer side of the at least one first coil. Optionally, the primary coil may be located on an outermost side, or the secondary coil may be located on the outermost side. In the possible implementation, a footprint of the primary coil, the secondary coil, and the at least one first coil in the layout structure of the adjustable transformer can be reduced.

In a possible implementation of the first aspect, in the layout of the adjustable transformer, the at least one first coil includes at least two first coils, the at least two first coils are located at one wiring layer, and the two first coils are symmetrically disposed. In the possible implementation, design flexibility of the at least two first coils in the layout structure of the adjustable transformer can be improved, and the footprint can be reduced.

In a possible implementation of the first aspect, the adjustable transformer further includes a tuning capacitor, and two ends of the tuning capacitor are respectively coupled to two ends of at least one of the primary coil or the secondary coil. In the possible implementation, integrity and stability of the adjustable transformer can be improved.

In a possible implementation of the first aspect, at least one of the first-stage amplifier or the second-stage amplifier is a differential amplifier. In the possible implementation, performance of the radio frequency circuit can further be improved.

In a possible implementation of the first aspect, the differential amplifier includes two common-source transistors. In the possible implementation, a simple and effective differential amplifier is provided, to simplify a circuit design of the radio frequency circuit.

In a possible implementation of the first aspect, the differential amplifier further includes degenerated inductors, the degenerated inductors are coupled to a common source terminal of the two transistors, and a center tap of the degenerated inductors is coupled to a ground terminal. In the possible implementation, an impedance at an input end of the differential amplifier can be reduced, thereby facilitating impedance matching and a broadband design.

In a possible implementation of the first aspect, the differential amplifier further includes two neutralizing capacitors, one neutralizing capacitor is coupled to a drain of a first transistor of the two transistors and a gate of a second transistor of the two transistors, and the other neutralizing capacitor is coupled to a gate of the first transistor and a drain of the second transistor. In the possible implementation, the neutralizing capacitor is configured to offset parasitic capacitances of the two transistors, thereby improving stability of the circuit and increasing a gain of the circuit.

According to a second aspect, an adjustable transformer is provided. The adjustable transformer includes a primary coil, a secondary coil, and at least one first coil, the primary coil and the secondary coil are magnetically coupled, the at least one first coil is magnetically coupled to both the primary coil and the secondary coil, two ends of each of the at least one first coil are respectively coupled to two nodes, and an impedance between the two nodes is adjustable. In the possible implementation, mutual inductance between the first coil, the primary coil, and the secondary coil is changed by adjusting the impedance between the two ends of the first coil. In this way, the adjustable transformer is adjusted, and relatively desirable performance of the adjustable transformer can be ensured in an adjustment process.

In a possible implementation of the second aspect, a Q value enhancement circuit is disposed between the two ends of the first coil, and the Q value enhancement circuit is configured to increase a Q value of the adjustable transformer. In the possible implementation, the Q value enhancement circuit can increase a quality factor of the adjustable transformer, and can reduce a loss of a passive component in the adjustable transformer.

In a possible implementation of the second aspect, the Q value enhancement circuit includes a cross-coupling field effect transistor (FET) pair, configured to provide negative resistance compensation for the first coil. In the possible implementation, the quality factor of the adjustable transformer can be increased.

In a possible implementation of the second aspect, the Q value enhancement circuit further includes a variable current source, configured to provide a current for the cross-coupling FET pair. In the possible implementation, the quality factor of the adjustable transformer can be increased.

In a possible implementation of the second aspect, an adjustable resistor or a switch is disposed between the two ends of the first coil. In the possible implementation, the mutual inductance between the first coil, the primary coil, and the secondary coil can be changed by adjusting a status of the switch to different states (for example, an open state and a closed state) or adjusting a resistance of the adjustable resistor. In this way, the adjustable transformer is adjusted, and relatively desirable performance of a radio frequency circuit can be ensured in an adjustment process.

In a possible implementation of the second aspect, the switch is a transistor, and a gate voltage of the transistor is adjustable. In the possible implementation, a manner of implementing the switch by using the transistor is provided, to simplify a circuit design of the adjustable transformer.

In a possible implementation of the second aspect, in a layout structure of the adjustable transformer, the primary coil, the secondary coil, and the at least one first coil are disposed at at least one wiring layer. In the possible implementation, diversity and flexibility of the layout structure of the adjustable transformer can be improved.

In a possible implementation of the second aspect, in a layout of the adjustable transformer, the primary coil, the secondary coil, and the at least one first coil are disposed at one wiring layer, and the primary coil and the secondary coil are located on an outer side of the first coil. Optionally, the primary coil may be located on an outermost side, or the secondary coil may be located on the outermost side.

In a possible implementation of the second aspect, in the layout of the adjustable transformer, the at least one first coil includes at least two first coils, the at least two first coils are located at one wiring layer, and the at least two first coils are symmetrically disposed. In the possible implementation, design flexibility of the at least two first coils in the layout structure of the adjustable transformer can be improved, and a footprint can be reduced.

In a possible implementation of the second aspect, the adjustable transformer further includes a tuning capacitor, and two ends of the tuning capacitor are respectively coupled to two ends of at least one of the primary coil or the secondary coil. In the possible implementation, integrity and stability of the adjustable transformer can be improved.

In a possible implementation of the second aspect, the adjustable transformer is an input transformer, a center tap of the primary coil is coupled to a ground terminal, and a center tap of the secondary coil is coupled to a bias voltage terminal. In the possible implementation, performance of the input transformer can further be improved.

In a possible implementation of the second aspect, the adjustable transformer is an output transformer, a center tap of the primary coil is coupled to a power supply terminal, and a center tap of the first coil is coupled to a ground terminal. In the possible implementation, performance of the input transformer can further be improved.

In a possible implementation of the second aspect, the primary coil of the adjustable transformer is coupled to a first amplifier, the secondary coil of the adjustable transformer is coupled to a second amplifier, and the impedance between the two nodes is adjusted to change an operating frequency of the radio frequency circuit including the first amplifier, the adjustable transformer, and the second amplifier.

According to a third aspect, a radio frequency front-end circuit is provided. The radio frequency front-end circuit includes the adjustable transformer provided in any one of the second aspect or the possible implementations of the second aspect. The adjustable transformer is configured to support the radio frequency front-end circuit in implementing switching between different frequency bands in a 5G millimeter wave.

In a possible implementation of the third aspect, the radio frequency front-end circuit is one of the following circuits: a radio frequency amplifier, a filter, a frequency mixer, a low noise amplifier, a variable gain amplifier, and an attenuator.

According to a fourth aspect, a communications device is provided. The communications device includes the radio frequency front-end circuit provided in any one of the second aspect or the possible implementations of the second aspect and a frequency mixing circuit coupled to the radio frequency front-end circuit.

It can be understood that the adjustable transformer, the radio frequency front-end circuit, and the communications device provided above all include the adjustable transformer in the radio frequency circuit provided above. Therefore, for beneficial effects that can be achieved by the adjustable transformer, the radio frequency front-end circuit, and the communications device, reference may be made to the beneficial effects of the radio frequency circuit provided above. Details are not described herein again.

DETAILED DESCRIPTION OF ILLUSTRATIVE EMBODIMENTS

Figure 1:
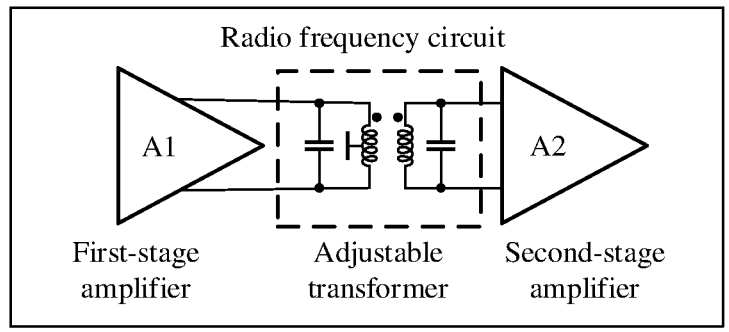
FIG. 1 is a schematic structural diagram of a radio frequency circuit according to an embodiment of this application.

In this application, "at least one" means one or more, and "a plurality of" means two or more. The term "and/or" describes an association relationship for describing associated objects and represents that three relationships may exist. For example, A and/or B may represent the following three cases: Only A exists, both A and B exist, and only B exists, where A and B may be singular or plural. "The following at least one (item)" or a similar expression thereof means any combination of these items, including a singular (item) or any combination of plural (items). For example, at least one (item) of a, b, or c may represent a; b; c; a and b; a and c; b and c; or a, b, and c, where a, b, and c each may be in a singular or plural form. The character "/" generally indicates an "or" relationship between the associated objects. In addition, in the embodiments of this application, terms such as "first" and "second" are not used to limit a quantity and an execution sequence.

It should be noted that, in this application, the word "example" or "for example" is used to represent giving an example, an illustration, or a description. Any embodiment or design scheme described as an "example" or "for example" in this application should not be explained as being more preferred or having more advantages than another embodiment or design scheme. Exactly, use of the word "example" or "for example" or the like is intended to present a relative concept in a specific manner.

The 5G standard defines four frequency bands in millimeter waves, among which three frequency bands are an n258 frequency band, an n257 frequency band, and an n261 frequency band. The n258 frequency band needs to support a frequency range (24.25 GHz-27.5 GHz), the n257 frequency band needs to support a frequency range (26.5 GHz-29.5 GHz), and the n261 frequency band needs to support a frequency range (27.5 GHz-28.35 GHz). For a 5G radio frequency transceiver, different frequency bands usually need to be covered to support different modes. To be specific, an operating frequency band of the 5G radio frequency transceiver needs to cover the n258 frequency band, the n257 frequency band, and the n261 frequency band, and in this case, a range of the operating frequency band of the 5G radio frequency transceiver is at least (24.25 GHz-29.5 GHz). However, compared with three frequency bands defined in a long term evolution (LTE) system (which may also be referred to as a 4G communications system), that is, a low frequency band (LB), a middle frequency band (MB), and a high frequency band (HB), each of the three NR frequency bands is corresponding to a bandwidth higher than bandwidths of the LB, the MB, and the HB. In a design of the 5G radio frequency transceiver, if an architecture of a 4G radio frequency transceiver is still used (the 4G radio frequency transceiver has a fixed operating frequency band that can cover all of the LB, the MB and the HB), the fixed operating frequency band of the 5G radio frequency transceiver needs to cover a frequency band with a bandwidth of 5.25 GHz (that is, a difference between 29.5 GHz and 24.25 GHz). Even if no design margin is reserved, a fractional bandwidth (FBW) of the frequency band (24.25 GHz-29.5 GHz) is greater than 19.5%. Consequently, it is rather difficult to implement a circuit in practice. In addition, the 5G radio frequency transceiver also needs to support beamforming characteristics. This further increases system complexity and design costs. If system design complexity and design costs are ignored, and only a 20% frequency band proportion for the 4G radio frequency transceiver is considered, two different sets of radio frequency transceivers are required to implement coverage of different frequency bands in a 5G millimeter wave. As a result, the architecture of the 4G radio frequency transceiver no longer can be applied to the 5G radio frequency transceiver.

However, according to analysis, the frequency bands in the 5G millimeter wave overlap. If the n258 and n257 frequency bands can be covered, the n261 frequency band can also be covered. Therefore, in a millimeter wave scenario, a radio frequency circuit applied to a radio frequency transceiver is proposed. For the radio frequency transceiver, different frequency bands in the 5G millimeter wave are covered by using a frequency modulation function of the radio frequency circuit.

FIG. 1 is a schematic structural diagram of a radio frequency circuit according to an embodiment of this application. Refer to FIG. 1. The radio frequency circuit is used for receiving or sending performed in a 5G millimeter wave, and the radio frequency circuit includes an adjustable transformer T, a first-stage amplifier A1, and a second-stage amplifier A2. The first-stage amplifier A1 is coupled to the second-stage amplifier A2 by using the adjustable transformer T, and a bandwidth of the adjustable transformer T is adjustable. When the bandwidth of the adjustable transformer T is adjusted, an operating frequency band of the radio frequency circuit covers an n258 frequency band and an n257 frequency band (that is, the operating frequency band of the radio frequency circuit is switched from the n258 frequency band to the n257 frequency band, or switched from the n257 frequency band to the n258 frequency band), or the n258 frequency band and an n261 frequency band (that is, the operating frequency band of the radio frequency circuit is switched from the n258 frequency band to the n261 frequency band, or switched from the n261 frequency band to the n258 frequency band).

In the radio frequency circuit provided in this embodiment of this application, the bandwidth of the adjustable transformer T is adjusted to change the operating frequency band of the radio frequency circuit, to implement coverage of different frequency bands in the 5G millimeter wave. In other words, signal receiving or sending in different frequency bands can be implemented by using one radio frequency circuit. This greatly reduces system costs, and reduces design complexity of the radio frequency circuit. Specifically, a bandwidth of the n257 frequency band is 3 GHz, a bandwidth of the n258 frequency band is 3.25 GHz, and a bandwidth of the n261 frequency band is 0.85 GHz. In this case, when the system switches the operating frequency band of the radio frequency circuit to the n257 frequency band, the bandwidth of the adjustable transformer T may be adjusted to 3 GHz to adapt to the n257 frequency band. Correspondingly, when the system switches the operating frequency band of the radio frequency circuit to the n258 frequency band, the bandwidth of the adjustable transformer may be adjusted to 3.25 GHz. When the system switches the operating frequency band of the radio frequency circuit to the n261 frequency band, the bandwidth of the adjustable transformer may be adjusted to 0.85 GHz. A person skilled in the art should know that although the 5G standard defines four NR frequency bands, a network of an operator usually does not support all the NR frequency bands, but supports only a part of the frequency bands. Therefore, in this technical solution of this application, the bandwidth of the adjustable transformer may be adjusted to a corresponding bandwidth based on the NR frequency band that needs to be currently supported by the radio frequency circuit, without a need to cover the n257, n28, and n261 frequency bands while using the fixed frequency band (24.25 GHz-29.5 GHz) like the 4G radio frequency transceiver. A maximum bandwidth of the adjustable transformer T is 3.25 GHz, which is much smaller than the bandwidth (5.25 GHz) of the fixed frequency band (24.25 GHz-29.5 GHz). Therefore, it is easier to implement a circuit design.

Optionally, the adjustable transformer T may include an adjustable switch, and the adjustable switch may be configured to adjust the adjustable transformer T. The adjustable switch may be configured to discretely adjust the adjustable transformer T. For example, dedicated digital trimming bits are set on the adjustable switch, and the adjustable transformer T is discretely adjusted by using the digital trimming bits.

Figure 2A:
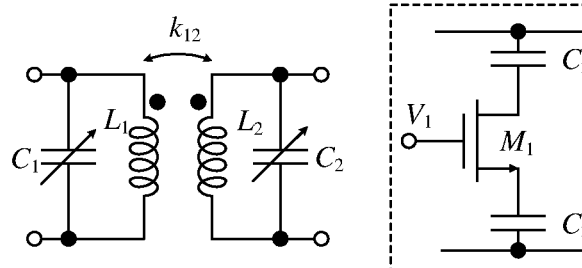
FIG. 2(a), FIG. 2(b), and FIG. 2(c) are a schematic structural diagram 1 of an adjustable transformer according to an embodiment of this application.
Figure 2B:
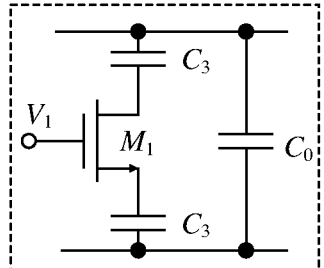
Figure 2C:
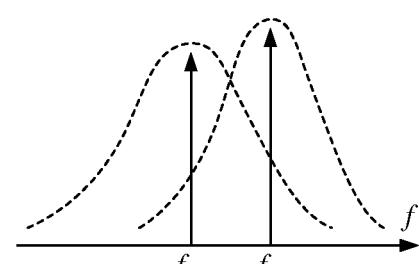

In a possible implementation, FIG. 2(a), FIG. 2(b), and FIG. 2(c) are a schematic structural diagram of an adjustable transformer according to an embodiment of this application. The adjustable transformer T may include a primary coil $L_1$, a secondary coil $L_2$, a tuning capacitor C1 connected to two ends of the primary coil $L_1$, and a tuning capacitor C2 connected to two ends of the secondary coil $L_2$. The tuning capacitor C1 and the tuning capacitor C2 may also be referred to as switching capacitors. Specifically, the adjustable transformer is adjusted by adjusting a capacitance of the switching capacitor. $k_{12}$ in FIG. 2(a), FIG. 2(b), and FIG. 2(c) represents a magnetic coupling coefficient between the primary coil $L_1$ and the secondary coil $L_2$.

For example, as shown in FIG. 2(a), FIG. 2(b), and FIG. 2(c), the switching capacitor may include a capacitor C0, two capacitors C3, and a transistor M1. The transistor may also be referred to as a metal oxide semiconductor (metal oxide semiconductor, MOS) transistor. An example in which the transistor M1 is an NMOS transistor is used for description in FIG. 2(a), FIG. 2(b), and FIG. 2(c). For example, the switching capacitor is the tuning capacitor C1. Two ends of the capacitor C0 are respectively connected to the two ends of the primary coil $L_1$, one end of a first capacitor C3 is connected to one end of the primary coil $L_1$, the other end of the first capacitor C3 is connected to a drain (d) of the NMOS transistor, one end of a second capacitor C3 is connected to the other end of the primary coil $L_1$, the other end of the second capacitor C3 is connected to a source (s) of the NMOS transistor, and a gate (g) of the NMOS transistor is connected to a voltage terminal V1.

Specifically, when the voltage terminal V1 is at a low level, the NMOS transistor is in an off state, and the capacitor C0, the two capacitors C3, and a parasitic capacitor formed by the NMOS transistor in the off state together form a tuning capacitor in a first frequency band $f_{RF1}$. When the voltage terminal V1 is at a high level, the NMOS transistor is in an on state, the two capacitors C3 and the NMOS transistor form a new larger capacitor, and this capacitor and the capacitor C0 together form a tuning capacitor in a first frequency band $f_{RF2}$.

However, performance of the adjustable transformer shown in FIG. 2(a), FIG. 2(b), and FIG. 2(c) is undesirable, mainly for the reason that a Q value of the switching capacitor may decrease due to turning on of the M1, causing a Q value of an LC resonant cavity to decrease. Consequently, a loss of the adjustable transformer is greatly increased, and the change in the Q value of the switching capacitor also causes a change in a frequency response of a circuit. In addition, nonlinearity is introduced to the M1 in the switching capacitor with signal enhancement, resulting in a decrease in a linear range of the radio frequency circuit using the adjustable transformer.

Figure 3:
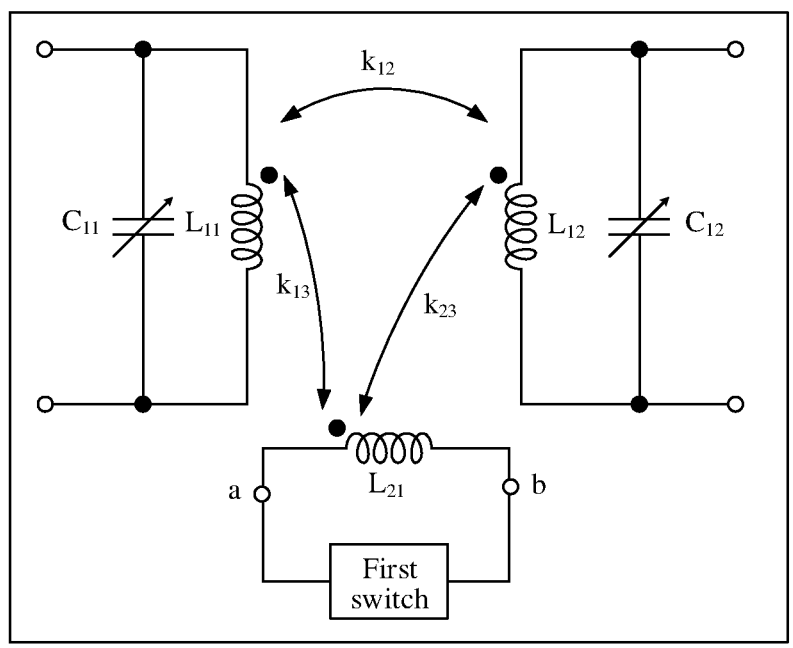
FIG. 3 is a schematic structural diagram 2 of an adjustable transformer according to an embodiment of this application.

In another possible implementation, FIG. 3 is a schematic structural diagram of another adjustable transformer according to an embodiment of this application. Performance of the adjustable transformer shown in FIG. 3 is better than that of the adjustable transformer shown in FIG. 2(a), FIG. 2(b), and FIG. 2(c). As shown in FIG. 3, the adjustable transformer T includes a primary coil $L_{11}$, a secondary coil $L_{12}$, and at least one first coil magnetically coupled to both the primary coil $L_{11}$ and the secondary coil $L_{12}$. Two ends of the first coil are respectively coupled to two nodes (denoted as a and b in FIG. 3), and an impedance between the two nodes is adjustable. Specifically, a bandwidth of the adjustable transformer is adjusted by adjusting the impedance between the two nodes. An example in which the at least one first coil includes a first coil $L_{21}$ is used for description in FIG. 3.

For example, a first switch or a first adjustable resistor that forms a loop with the first coil $L_{21}$ is disposed between the two ends of the first coil $L_{21}$. An example in which the two ends of the first coil $L_{21}$ are connected to the first switch is used for description in FIG. 3. The adjustable transformer may further include a primary tuning capacitor $C_{11}$ connected to two ends of the primary coil $L_{11}$ and a secondary tuning capacitor $C_{12}$ connected to two ends of the secondary coil $L_{12}$.

When the two ends of the first coil $L_{23}$ are connected to the first switch, by controlling the first switch to be in an open state, the impedance between the two nodes of the first coil $L_{23}$ may be infinite, and then mutual coupling between the first coil $L_{23}$, the primary coil $L_{11}$, and the secondary coil $L_{12}$ can be turned off. Similarly, by controlling the first switch to be in a closed state (which may also be referred to as an on state), the impedance between the two nodes of the first coil $L_{21}$ may be 0, and then mutual coupling between the first coil $L_{21}$, the primary coil $L_{11}$, and the secondary coil $L_{12}$ can be turned on. When the two ends of the first coil are connected to the first adjustable resistor, mutual inductance between the first coil $L_{21}$, the primary coil $L_{11}$, and the secondary coil $L_{12}$ can be controlled by controlling a resistance of the first adjustable resistor. When the resistance of the first adjustable resistor is close to 0, the mutual inductance between the first coil $L_{21}$, the primary coil $L_{11}$, and the secondary coil $L_{12}$ may be equivalent to the corresponding mutual inductance when the first switch is in the closed state. When the resistance of the first adjustable resistor is close to infinity, the mutual inductance between the first coil $L_{21}$, the primary coil $L_{11}$, and the secondary coil $L_{12}$ may be equivalent to the corresponding mutual inductance when the first switch is in the open state.

The following uses an example in which the two ends of the first coil $L_{21}$ are connected to the first switch to describe a frequency band of the adjustable transformer.

When the first switch is configured to turn off the mutual coupling between the first coil $L_{21}$, the primary coil $L_{11}$, and the secondary coil $L_{12}$, the adjustable transformer is in a first frequency band. When the first switch is configured to turn on the mutual coupling between the first coil $L_{21}$, the primary coil $L_{11}$, and the secondary coil $L_{12}$, the adjustable transformer is in a second frequency band.

Specifically, when the first switch is configured to turn off the mutual coupling between the first coil $L_{21}$, the primary coil $L_{11}$, and the secondary coil $L_{12}$, the first switch is in the open state. In this case, coupling currents between the first coil $L_{21}$, the primary coil $L_{11}$, and the secondary coil $L_{12}$ are so small that impact can be ignored, and the primary coil $L_{11}$ and the secondary coil $L_{12}$ in this transformer are the same as those in a conventional transformer. In other words, self-inductance of the primary coil $L_{11}$, self-inductance of the secondary coil $L_{12}$, and mutual inductance and a mutual inductance coefficient between the primary coil $L_{11}$ and the secondary coil $L_{12}$ do not change. When the first switch is configured to turn on the mutual coupling between the first coil $L_{21}$, the primary coil $L_{11}$, and the secondary coil $L_{12}$, the first switch is in the closed state. In this case, coupling currents between the first coil $L_{21}$, the primary coil $L_{11}$, and the secondary coil $L_{12}$ are relatively large. Therefore, self-inductance of the primary coil $L_{11}$, self-inductance of the secondary coil $L_{12}$, and mutual inductance and a mutual inductance coefficient between the primary coil $L_{11}$ and the secondary coil $L_{12}$ change.

For example, it is assumed that the mutual inductance coefficient and the mutual inductance between the primary coil $L_{11}$ and the secondary coil $L_{12}$ in the adjustable transformer are $k_{12}$ and M, respectively, a mutual inductance coefficient between the first coil $L_{21}$ and the primary coil $L_{11}$ is $k_{13}$, and a mutual inductance coefficient between the first coil $L_{21}$ and the secondary coil $L_{12}$ is $k_{23}$. When the first switch is in the closed state, changed self-inductance $L'_{11}$ of the primary coil $L_{11}$, changed self-inductance $L'_{12}$ of the secondary coil $L_{12}$, a changed mutual inductance coefficient $k'_{12}$ and changed mutual inductance M' between the primary coil $L_{11}$ and the secondary coil $L_{12}$ may be obtained according to the following formula (1), where in the formula, $k_{12}<1$, $k_{13}<1$, and $k_{23}<1$:

$$L'_1 = (1 - k_{13}^2)L_{11}$$
$$L'_2 = (1 - k_{23}^2)L_{12}$$
$$M' = \frac{M}{\sqrt{(1-k_{13}^2)(1-k_{23}^2)}}$$
$$K'_{12} = \left(1 - \frac{k_{13}k_{23}}{k_{12}}\right)\frac{k_{12}}{\sqrt{(1-k_{13}^2)(1-k_{23}^2)}}$$

(1)

Figure 4:
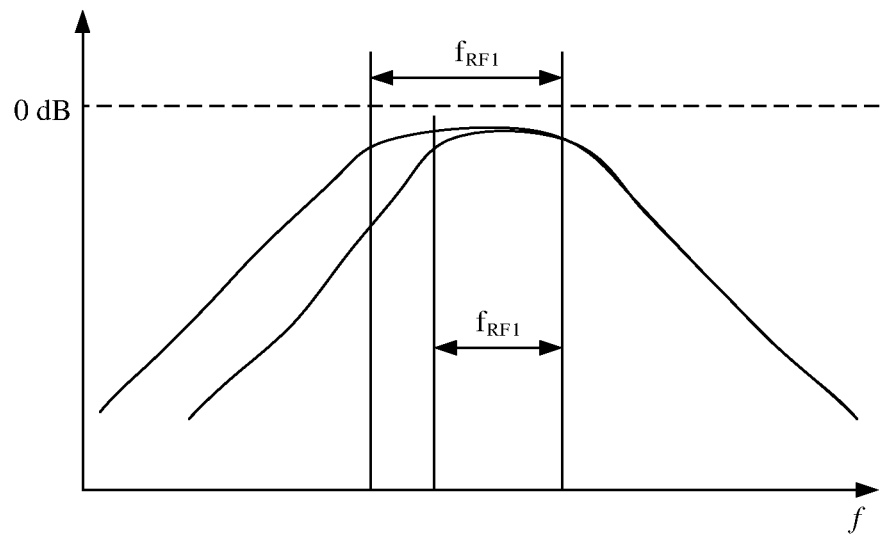
FIG. 4 is a schematic diagram 1 of frequency band switching according to an embodiment of this application.

Because parameters that determine a frequency response characteristic of the transformer are the self-inductance of the primary coil $L_{11}$, the self-inductance of the secondary coil $L_{12}$, and the mutual inductance coefficient between the primary coil $L_{11}$ and the secondary coil $L_{12}$, when the first switch is switched between different states, the adjustable transformer can be switched between different frequency bands. Then, a radio frequency circuit using the adjustable transformer can be switched between different frequency bands. Specifically, when the first switch is switched from the open state to the closed state, the frequency band of the adjustable transformer may be switched from the first frequency band to the second frequency band. When the first switch is switched from the closed state to the open state, the frequency band of the adjustable transformer may be switched from the second frequency band to the first frequency band. For example, the first frequency band and the second frequency band may be shown in FIG. 4. In FIG. 4, $f_{RF1}$ represents the first frequency band, and $f_{RF2}$ represents the second frequency band.

Figure 5:
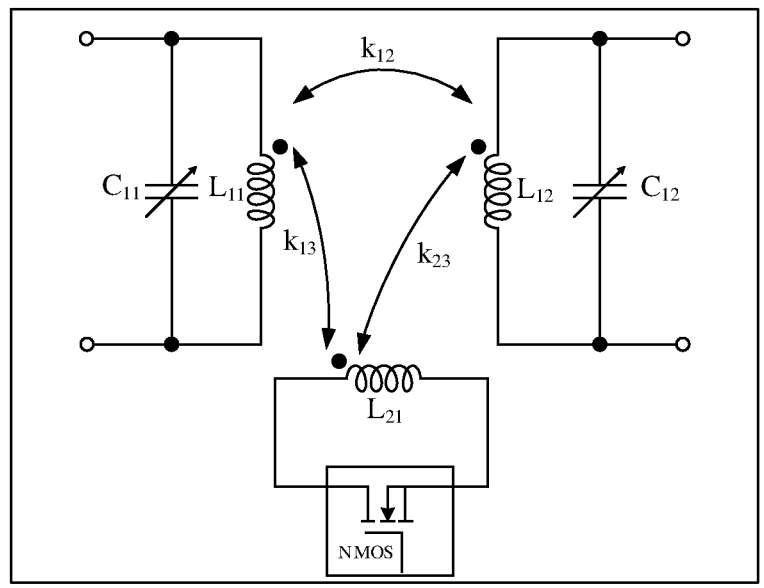
FIG. 5 is a schematic structural diagram 3 of an adjustable transformer according to an embodiment of this application.

In a feasible embodiment, as shown in FIG. 5, the first switch may include a transistor. The first switch is in the open state when the transistor is turned off, and the first switch is in the on state when the transistor is turned on. Turning on or turning off of the transistor may be controlled by using a digital logic voltage or an analog continuous voltage. An example in which the transistor is an NMOS transistor is used for description in FIG. 5.

Specifically, when the transistor is turned off, the transistor has a quite large impedance. In this case, the coupling currents between the first coil $L_{21}$, the primary coil $L_{11}$, and the secondary coil $L_{12}$ are so small that impact can be ignored. Therefore, the self-inductance of the primary coil $L_{11}$, the self-inductance of the secondary coil $L_{12}$, and the mutual inductance and the mutual inductance coefficient between the primary coil $L_{11}$ and the secondary coil $L_{12}$ do not change, so that the transformer whose bandwidth is controllable is in the first frequency band. When the transistor is turned on, the transistor has a quite small impedance. In this case, the coupling currents between the first coil $L_{21}$, the primary coil $L_{11}$, and the secondary coil $L_{12}$ are relatively large. Therefore, the self-inductance of the primary coil $L_{11}$, the self-inductance of the secondary coil $L_{12}$, and the mutual inductance and the mutual inductance coefficient between the primary coil $L_{11}$ and the secondary coil $L_{12}$ change, so that the transformer whose bandwidth is controllable is in the second frequency band.

Figure 6:
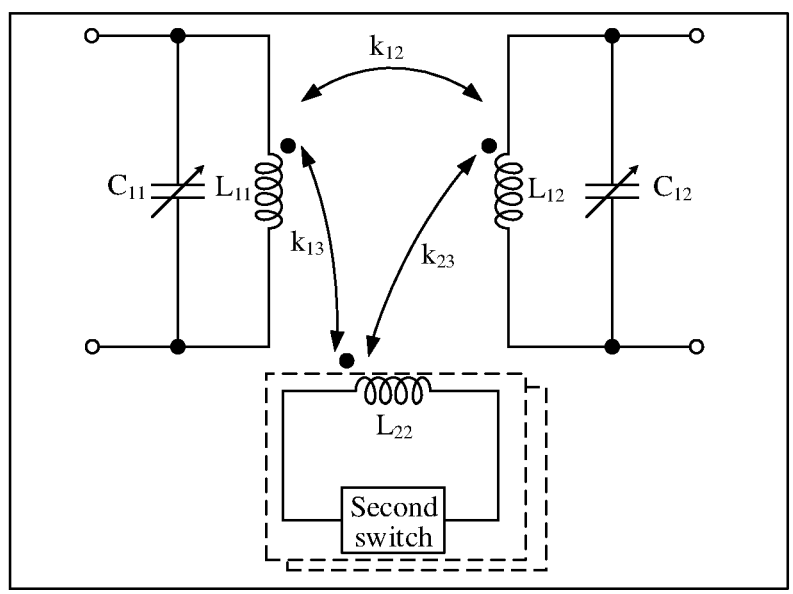
FIG. 6 is a schematic structural diagram 4 of an adjustable transformer according to an embodiment of this application.

Further, when the at least one first coil includes two or more coils, for ease of description, the other coil in the at least one first coil is referred to as a second coil $L_{22}$. As shown in FIG. 6, the adjustable transformer may further include the second coil $L_{22}$. A second switch or a second adjustable resistor that forms a loop with the second coil $L_{22}$ may be disposed between two ends of the second coil $L_{22}$, and the second coil $L_{22}$ is magnetically coupled to both the primary coil $L_{11}$ and the secondary coil $L_{12}$. An example in which the two ends of the second coil $L_{22}$ are connected to the second switch is used for description in FIG. 6. Control of mutual inductance between the second coil $L_{22}$, the primary coil $L_{11}$, and the secondary coil $L_{12}$ by the second switch or the second adjustable resistor is similar to the control of the mutual inductance between the first coil $L_{21}$, the primary coil $L_{11}$, and the secondary coil $L_{12}$ by the first switch or the first adjustable resistor.

The following uses an example in which the two ends of the second coil $L_{22}$ are connected to the second switch for description. When the second switch is configured to turn off the mutual coupling between the second coil $L_{22}$, the primary coil $L_{11}$, and the secondary coil $L_{12}$, the second switch is in an open state (in this case, an impedance between the two ends of the second coil $L_{22}$ may be infinite). When the second switch is configured to turn on the mutual coupling between the second coil $L_{22}$, the primary coil $L_{11}$, and the secondary coil $L_{12}$, the second switch is in a closed state (in this case, an impedance between the two ends of the second coil $L_{22}$ may be 0). Specifically, when the first switch is in the open state and the second switch is in the closed state, the adjustable transformer is in a third frequency band. In other words, the self-inductance of the primary coil $L_{11}$, the self-inductance of the secondary coil $L_{12}$, and the mutual inductance and the mutual inductance coefficient between the primary coil $L_{11}$ and the secondary coil $L_{12}$ change due to interposition of the second coil $L_{22}$. When the first switch is in the closed state and the second switch is in the closed state, the transformer whose bandwidth is controllable is in a fourth frequency band. In other words, the self-inductance of the primary coil $L_{11}$, the self-inductance of the secondary coil $L_{12}$, and the mutual inductance and the mutual inductance coefficient between the primary coil $L_{11}$ and the secondary coil $L_{12}$ change due to interposition of the first coil $L_{21}$ and the second coil $L_{22}$.

It should be noted that impact of the second switch and the second coil $L_{22}$ on the transformer is similar to impact of the first switch and the first coil $L_{21}$ on the transformer. For details thereof, reference is made to the foregoing related descriptions. Details are not described in this embodiment of this application again. In addition, a specific structure of the second switch is also similar to that of the first switch. For details thereof, refer to the related descriptions of the first switch. Details are not described in this embodiment of this application again, either.

It should be noted that, the foregoing provides descriptions only by using an example in which the adjustable transformer includes the first coil $L_{21}$, the first switch, the second coil $L_{22}$, and the second switch. In actual application, the adjustable transformer may include a plurality of coils similar to the first coil $L_{21}$ and a switch corresponding to each coil. For example, a quantity of the plurality of coils may be 3, 4, or 5. Impact of each coil and the corresponding switch on the adjustable transformer is similar to impact of the first coil $L_{21}$ and the first switch on the adjustable transformer. Details are not described in this embodiment of this application again.

Further, when a quantity of the at least one first coil is more than one, for ease of description, the first coil $L_{12}$, the second coil $L_{22}$, a third coil $L_{23}$, and other similar identifiers may be used to represent the at least one first coil. In a layout structure of the adjustable transformer, the primary coil $L_{11}$, the secondary coil $L_{12}$, and the at least one first coil are disposed at at least one wiring layer. For example, the at least one first coil includes the first coil $L_{21}$, the second coil $L_{22}$, and the third coil $L_{23}$. Specific distribution of the at least one first coil may be shown in FIG. 7(a) or FIG. 8(a).

Optionally, the primary coil $L_{11}$, the secondary coil $L_{12}$, and the at least one first coil may all be disposed at one wiring layer, or may be disposed at two or more wiring layers in a dispersed manner. In the layout structure of the adjustable transformer, when the primary coil $L_{11}$, the secondary coil $L_{12}$, the first coil $L_{21}$, and the at least one first coil are disposed at one wiring layer, the at least one first coil may be located on outer sides of the primary coil $L_{11}$ and the secondary coil $L_{12}$. In this case, the primary coil may be located on an innermost side, or the secondary coil may be located on the innermost side. Alternatively, the at least one first coil may be located on inner sides of the primary coil $L_{11}$ and the secondary coil $L_{12}$. In this case, the primary coil $L_{11}$ may be located on an outermost side, or the secondary coil $L_{12}$ may be located on the outermost side.

When the at least one first coil includes both the first coil $L_{21}$ and the second coil $L_{22}$, and the first coil $L_{21}$ and the second coil $L_{22}$ are disposed at one wiring layer, the second coil $L_{22}$ may be located on an outer side of the first coil $L_{21}$, or the second coil $L_{22}$ may be located on an inner side of the first coil $L_{21}$. Alternatively, the first coil $L_{21}$ and the second coil $L_{22}$ are symmetrical.

Figure 7A:
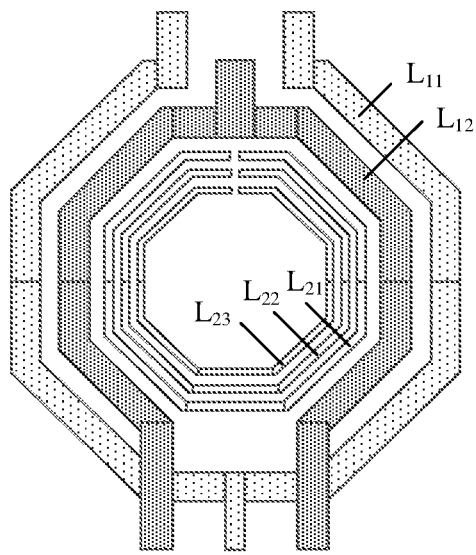
FIG. 7(a), FIG. 7(b), and FIG. 7(c) are a schematic structural diagram 5 of an adjustable transformer according to an embodiment of this application.
Figure 7B:
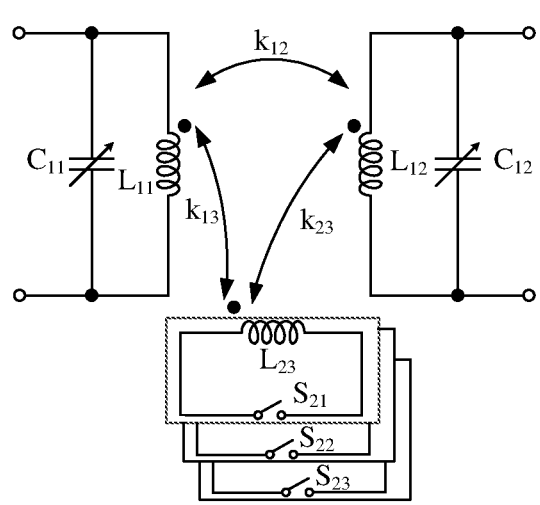
Figure 7C:
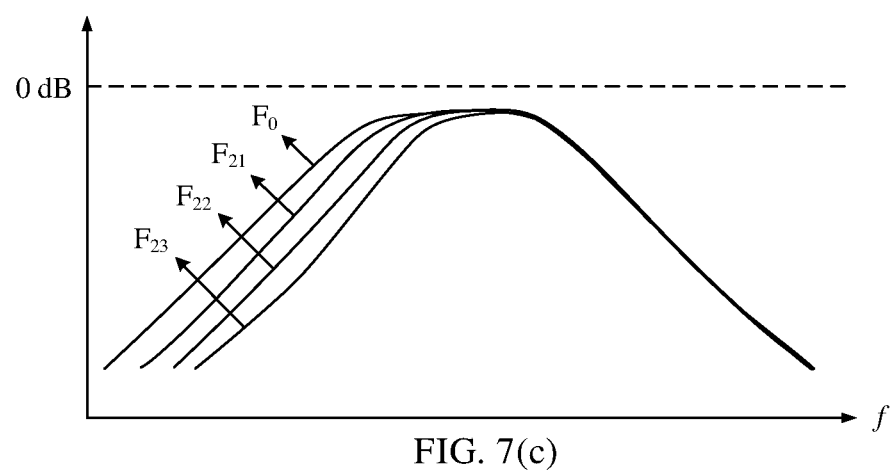

That the at least one first coil includes three coils $L_{21}$, $L_{22}$, and $L_{23}$, and the $L_{21}$, $L_{22}$, and $L_{23}$ are all located on the inner sides of the primary coil $L_{11}$ and the secondary coil $L_{12}$ is used as an example for description. FIG. 7(a) is a schematic diagram of distribution of the three coils $L_{21}$, $L_{22}$, and $L_{23}$, FIG. 7(b) is a schematic structural diagram of the adjustable transformer, and FIG. 7(c) shows spectral response curves of a plurality of frequency bands of the adjustable transformer. In FIG. 7(a), FIG. 7(b), and FIG. 7(c), $S_{21}$ represents a switch corresponding to $L_{21}$, $S_{22}$ represents a switch corresponding to $L_{22}$, $S_{23}$ represents a switch corresponding to $L_{23}$, $F_0$ represents a frequency band of the adjustable transformer when all the switches are in an open state, $F_{21}$ represents a frequency band of the adjustable transformer when only $S_{21}$ is in a closed state, $F_{22}$ represents a frequency band of the adjustable transformer when only $S_{22}$ is in a closed state, and $F_{23}$ represents a frequency band of the adjustable transformer when only $S_{23}$ is in a closed state.

Figure 8A:
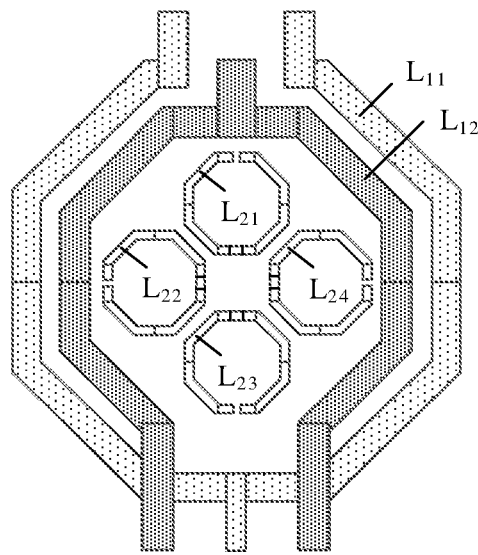
FIG. 8(a), FIG. 8(b), and FIG. 8(c) are a schematic structural diagram 6 of an adjustable transformer according to an embodiment of this application.
Figure 8B:
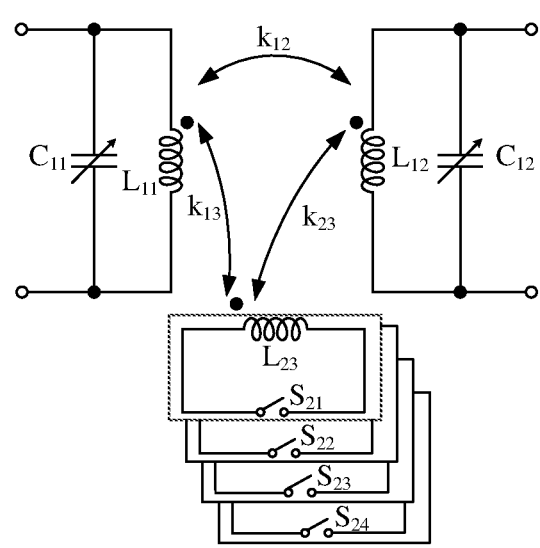
Figure 8C:
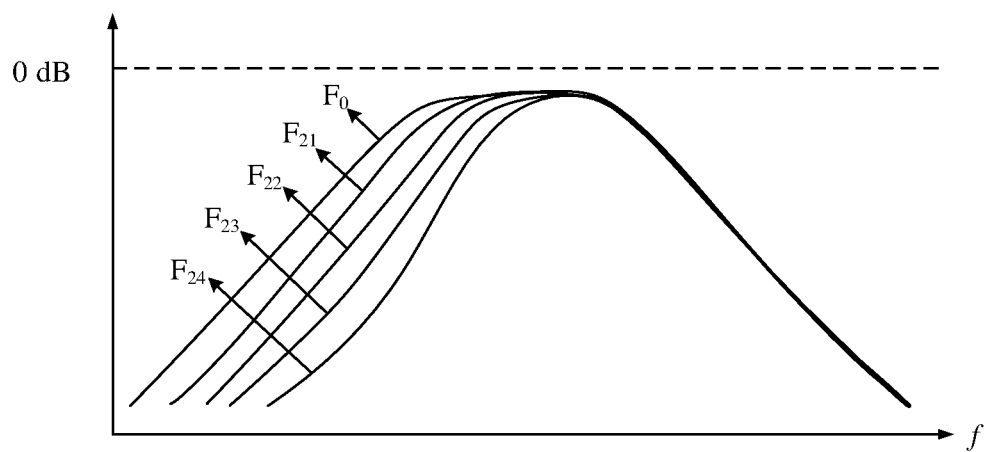

As shown in FIG. 8(a), FIG. 8(b), and FIG. 8(c), that the adjustable transformer includes four coils $L_{21}$, $L_{22}$, $L_{23}$, and $L_{24}$, and the $L_{21}$, $L_{22}$, $L_{23}$, and $L_{24}$ are all located on the inner sides of the primary coil $L_{11}$ and the secondary coil $L_{12}$ is used as an example for description. FIG. 8(a) is a schematic diagram of distribution of the four coils $L_{21}$, $L_{22}$, $L_{23}$, and $L_{24}$, FIG. 8(b) is a schematic structural diagram of the adjustable transformer, and FIG. 8(c) shows spectral response curves of a plurality of frequency bands of the adjustable transformer. In FIG. 8(a), FIG. 8(b), and FIG. 8(c), $S_{21}$ represents a switch corresponding to $L_{21}$, $S_{22}$ represents a switch corresponding to $L_{22}$, $S_{23}$ represents a switch corresponding to $L_{23}$, $S_{24}$ represents a switch corresponding to $L_{24}$, $F_0$ represents a frequency band of the adjustable transformer when all the switches are in an open state, $F_{21}$ represents a frequency band of the adjustable transformer when only $S_{21}$ is in a closed state, $F_{22}$ represents a frequency band of the adjustable transformer when only $S_{22}$ is in a closed state, $F_{23}$ represents a frequency band of the adjustable transformer when only $S_{23}$ is in a closed state, and $F_{24}$ represents a frequency band of the adjustable transformer when only $S_{24}$ is in a closed state.

Although distribution of the plurality of coils included in the adjustable transformer shown in FIG. 7(a), FIG. 7(b), and FIG. 7(c) is different from that shown in FIG. 8(a), FIG. 8(b), and FIG. 8(c), impact thereof on the frequency band of the adjustable transformer is similar.

Further, in the radio frequency circuit shown in FIG. 1, at least one of the first-stage amplifier A1 or the second-stage amplifier A2 may be a differential amplifier, and the differential amplifier may include two common-source transistors.

Figure 9:
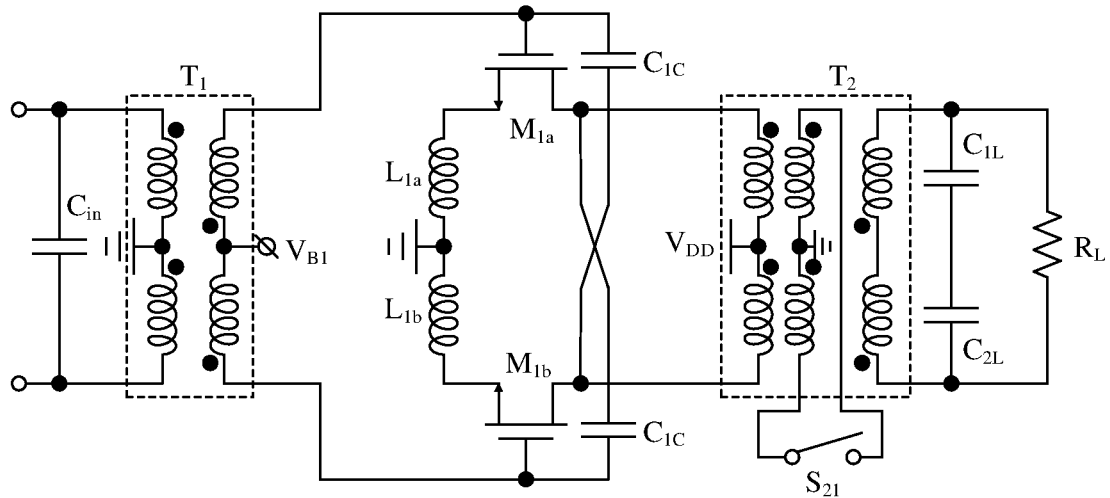
FIG. 9 is a schematic structural diagram of a differential amplifier according to an embodiment of this application.

Optionally, FIG. 9 is a schematic structural diagram of a differential amplifier according to an embodiment of this application. Referring to FIG. 9, the differential amplifier may include degenerated inductors (denoted as $L_{1a}$ and $L_{1b}$ that are connected in series in FIG. 9), two neutralizing capacitors $C_{1C}$, and two transistors (denoted as $M_{1a}$ and $M_{1b}$ in FIG. 9). A center tap of the degenerated inductors (that is, a connection point of $L_{1a}$ and $L_{1b}$) is coupled to a ground terminal. One neutralizing capacitor $C_{1C}$ of the two neutralizing capacitors $C_{1C}$ is coupled to a drain of a first transistor $M_{1a}$ and a gate of a second transistor $M_{1b}$, and the other neutralizing capacitor $C_{1C}$ is coupled to a gate of the first transistor $M_{1a}$ and a drain of the second transistor $M_{1b}$.

In FIG. 9, an input end of the differential amplifier may further be connected to an input transformer, and an output end of the differential amplifier may further be connected to an output transformer.

Specifically, the input transformer (denoted as T1 in FIG. 9) may include a primary coil and a secondary coil and a tuning capacitor $C_{in}$ coupled to the primary coil. The output transformer T2 may be the adjustable transformer in the radio frequency circuit provided above. In FIG. 9, the output transformer (denoted as T2 in FIG. 9) includes a primary coil, a secondary coil, and a first coil magnetically coupled to the primary coil and the secondary coil. Two ends of the first coil are connected to an adjustable resistor $R_{SW}$. The output transformer may further include a tuning capacitor (a tuning capacitor formed by connecting $C_{1L}$ and $C_{2L}$ in series in FIG. 9) coupled to two ends of the secondary coil. Two ends of the tuning capacitor are connected to a load resistor $R_L$.

In addition, a center tap of the primary coil in the input transformer is connected to the ground terminal, and a center tap of the secondary coil in the input transformer is connected to a bias voltage terminal $V_{B1}$. A center tap of the primary coil in the output transformer is connected to a power supply terminal $V_{DD}$, and a center tap of the first coil in the output transformer is coupled to the ground terminal.

It should be noted that in FIG. 9, the adjustable transformer provided in this embodiment of this application is applied only to the output transformer, and similarly can be applied to the input transformer. Switching between different frequency bands can be directly implemented if the adjustable transformer is applied to the output transformer, and switching between different frequency bands can also be implemented if the adjustable transformer is applied to the input transformer. Only the output transformer is used as an example for description in this embodiment of this application.

In the differential amplifier provided in this embodiment of this application, a real part of an impedance at the input end can be reduced by using the degenerated inductors $L_{1a}$ and $L_{1b}$, thereby facilitating impedance matching and a broadband design; and the neutralizing capacitors $C_{1C}$ may be configured to offset parasitic capacitances of the cross-coupling FET pair $M_{1a}$ and $M_{1b}$, thereby improving stability of the circuit and increasing a gain of the circuit.

In another feasible embodiment, the adjustable transformer in FIG. 1 may further include a Q value enhancement circuit connected to the two ends of the first coil $L_{21}$. The Q value enhancement circuit forms a loop with the first coil $L_{21}$, and the Q value enhancement circuit is configured to increase a Q value of the adjustable transformer. The Q value enhancement circuit may be a Q value enhancement circuit in the prior art, or may be a Q value enhancement circuit provided in this application. This is not specifically limited in this embodiment of this application. In the Q value enhancement circuit provided in this application, the Q value enhancement circuit may include a cross-coupling FET pair configured to provide negative resistance compensation for the first coil $L_{21}$, and may further include a variable current source configured to provide a current for the cross-coupling FET pair.

Figure 10:
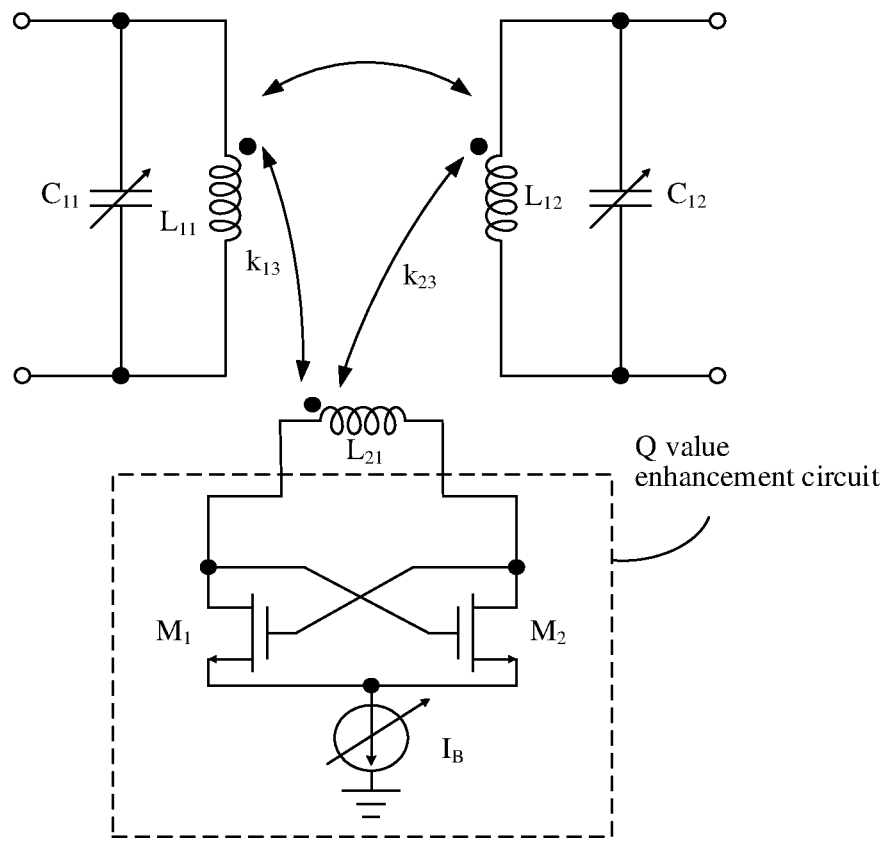
FIG. 10 is a schematic structural diagram 7 of an adjustable transformer according to an embodiment of this application.

For example, in FIG. 10, the Q value enhancement circuit may specifically include a first MOS transistor M1, a second MOS transistor M2, and a variable current source $I_B$. Both a drain of the first MOS transistor M1 and a gate of the second MOS transistor M2 are coupled to one end of the first coil $L_{21}$. Both a gate of the first MOS transistor M1 and a drain of the second MOS transistor M2 are coupled to the other end of the first coil $L_{21}$. Both a source of the first MOS transistor M1 and a source of the second MOS transistor M2 are coupled to an input end of the variable current source $I_B$. An output end of the variable current source $I_B$ is coupled to a ground terminal.

In an on-chip passive component, due to a relatively high resistance of interconnections and a substrate loss, especially Q values of an inductor and the transformer are not quite high (usually less than 20). To increase the Q values of the on-chip passive inductor and the transformer and reduce a loss of the passive component, the variable current source $I_B$ shown in FIG. 10 may be configured to increase the Q values in this embodiment of this application. Specifically, in FIG. 10, the M1 and the M2 are a cross-coupling FET pair, and a drain signal of the M1 and a drain signal of the M2 are differential signals. In an alternating current operating condition, a real part of an equivalent impedance between the M1 and the M2 is a negative resistance, that is, the negative resistance is introduced by using the M1 and the M2. In this way, a loss of the first coil $L_{21}$ can be compensated for, thereby increasing the Q value. The negative resistance introduced by using the M1 and the M2 is $-1/g_m$, and $g_m$ is a sum of transconductances of the M1 and the M2. The sum of transconductances can be controlled by a current of the variable current source $I_B$, and the current determines a magnitude of the sum $g_m$ of transconductances.

It should be noted that only an example in which the MOS transistor is an NMOS transistor is used for description in FIG. 10. In actual application, the MOS transistor may alternatively be a PMOS transistor, another component having a same function, or the like. This is not specifically limited in this embodiment of this application.

Based on the foregoing descriptions, an embodiment of this application further provides an adjustable transformer. The adjustable transformer may include a primary coil, a secondary coil, and at least one first coil, the primary coil and the secondary coil are magnetically coupled, the at least one first coil is magnetically coupled to both the primary coil and the secondary coil, two ends of each of the first coil are respectively coupled to two nodes, and an impedance between the two nodes is adjustable.

In a possible embodiment, a Q value enhancement circuit that forms a loop with the first coil is further disposed between the two nodes, and the Q value enhancement circuit is configured to increase a Q value of the adjustable transformer. Optionally, the Q value enhancement circuit includes a cross-coupling FET pair, configured to provide negative resistance compensation for the first coil. The Q value enhancement circuit further includes a variable current source, configured to provide a current for the cross-coupling FET pair.

In another possible embodiment, an adjustable resistor or a switch that forms a loop with the first coil is further disposed between the two nodes. Optionally, the switch is a transistor, and a gate voltage of the transistor is adjustable. In a layout structure of the adjustable transformer, the primary coil, the secondary coil, and the at least one first coil are disposed at at least one wiring layer. Alternatively, in a layout of the adjustable transformer, the primary coil, the secondary coil, and the at least one first coil are disposed at one wiring layer, and the primary coil and the secondary coil are located on an outer side of the at least one first coil. Optionally, the primary coil may be located on an outermost side, or the secondary coil may be located on the outermost side.

Further, the at least one first coil includes at least two first coils; and in the layout of the adjustable transformer, the at least two first coils are disposed at one wiring layer, and the at least two first coils are symmetrically disposed.

In addition, the adjustable transformer further includes a tuning capacitor, and two ends of the tuning capacitor are respectively magnetically coupled to two ends of at least one of the primary coil or the secondary coil.

Optionally, the adjustable transformer is an input transformer, a center tap of the primary coil is coupled to a ground terminal, and a center tap of the secondary coil is coupled to a bias voltage terminal. In the possible implementation, performance of the input transformer can further be improved. Alternatively, the adjustable transformer is an output transformer, a center tap of the primary coil is coupled to a power supply terminal, and a center tap of the first coil is coupled to a ground terminal.

It should be noted that, for a specific structure and related descriptions of the adjustable transformer, refer to the descriptions of the adjustable transformer in the radio frequency circuit provided above. For example, for details thereof, reference may be made to the related descriptions in FIG. 3 to FIG. 8(a), FIG. 8(b), and FIG. 8(c), and FIG. 10. Details are not described in this embodiment of this application again. In this embodiment of this application, one or more adjustable coils are added to the adjustable transformer, to change parameters such as self-inductance of the primary coil, self-inductance of the secondary coil, and a coupling coefficient between the primary coil and the secondary coil in the transformer, thereby implementing frequency band switching. In addition, the solution provided in this embodiment of this application does not additionally increase a coil area, and can overcome a series of existing problems that occur in a switching capacitor, such as Q value reduction. Therefore, the solution is of relatively high practical value in circuits such as radio frequency and microwave circuits.

In another embodiment of this application, a radio frequency front-end circuit is further provided. The radio frequency front-end circuit may include the adjustable transformer provided in any one of FIG. 3 to FIG. 8(a), FIG. 8(b), and FIG. 8(c), and FIG. 10. The adjustable transformer is configured to adjust a bandwidth of the radio frequency front-end circuit for a 5G millimeter wave.

Optionally, the radio frequency front-end circuit may be one of the following circuits: a radio frequency amplifier, a filter, a frequency mixer, a low noise amplifier, a variable gain amplifier, an attenuator, and the like. The adjustable transformer can also be applied to a transmission system or a receiving system. For example, the transmission system may be a superheterodyne transmission system. In the superheterodyne transmission system, there may be a fixed frequency difference between a radio frequency and a local oscillator frequency. The fixed frequency difference may also be referred to as an intermediate frequency (IF). Performing amplification and filtering on intermediate frequency signals enables normal data or voice receiving/sending. At present, the superheterodyne is mainly targeted for a direct frequency conversion system in which the local oscillator frequency and the radio frequency are a same center frequency.

Figure 11:
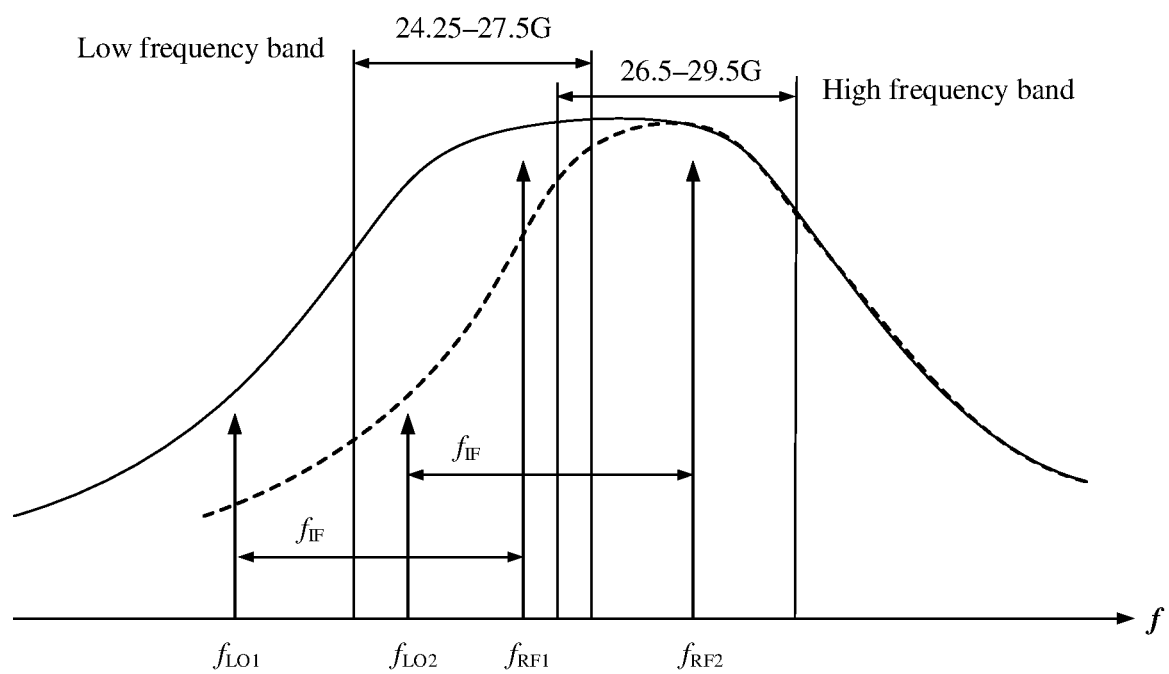
FIG. 11 is a schematic diagram 2 of frequency band switching according to an embodiment of this application.

For example, in some superheterodyne transmission systems, as shown in FIG. 11, the intermediate frequency is a fixed/IF, and a carrier frequency $f_{LO}$ varies with a radio frequency $f_{RF}$ (for example, $f_{LO1}$ varies with $f_{RF1}$ and $f_{LO2}$ varies with $f_{RF2}$). If a system bandwidth design does not vary accordingly, when a low frequency band is switched to a high frequency band (for example, 24.25 GHz-27.5 GHz is switched to 16.5 GHz-29.5 GHz), the carrier frequency $f_{LO2}$ in the high frequency band falls into a gain range of an entire link, as shown in a solid line part in FIG. 11. In this case, a carrier leakage problem is relatively serious, and an interference signal cannot be filtered out by using a radio frequency method. According to the solution provided in this embodiment of this application, when the low frequency band is switched to the high frequency band, switching between frequency response characteristics of the link may be performed to make the carrier frequency $f_{LO2}$ in the high frequency band fall into a relatively narrow dashed line part. In this way, in an operating range of the high frequency band, the corresponding carrier frequency $f_{LO2}$ is relatively strongly suppressed. Therefore, the carrier leakage problem can be resolved without using an on-chip filter or an off-chip filter. Similarly, in some receiving system application scenarios, in a frequency band switching process, when an input interference signal is located in a receiving range of the low frequency band, the input interference signal may be filtered out by using a method for switching between the frequency responses of the link.

It should be noted that, the embodiments of this application and the accompanying drawings are merely examples. Each MOS transistor in any embodiment or accompanying drawing may be a single MOS transistor that satisfies a required start-up gain or a required on-current; or may be a MOS transistor combination that is formed by connecting a plurality of MOS transistors in parallel and that satisfies the required start-up gain or the required on-current, that is, a sum of start-up gains corresponding to the plurality of MOS transistors is greater than or equal to the required start-up gain. Each capacitor in the embodiments of this application may be one capacitor that satisfies a required capacitance; or may be a capacitor combination that is formed by connecting a plurality of capacitors in parallel or in series and that satisfies the required capacitance, that is, a corresponding capacitance obtained after the plurality of capacitors are connected in parallel or in series is equal to the required capacitance. Each inductor in the embodiments of this application may be one inductor that satisfies a required inductance; or may be an inductor combination that is formed by connecting a plurality of inductors in parallel or in series and that satisfies the required inductance. Each resistor in the embodiments of this application may be one resistor that satisfies a required resistance; or may be a resistor combination that is formed by connecting a plurality of resistors in parallel or in series and that satisfies the required resistance, that is, a corresponding resistance obtained after the plurality of resistors are connected in parallel or in series is equal to the required resistance.

In conclusion, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A radio frequency circuit, comprising:
an adjustable transformer, comprising a primary coil, a secondary coil, and at least one first coil, wherein the primary coil and the secondary coil are magnetically coupled to each other, the at least one first coil is magnetically coupled to both the primary coil and the secondary coil, a first end of the at least one first coil is coupled to a first node and a second end of the at least one first coil is coupled to a second node, and an impedance between the first node and the second node is adjustable;
a first-stage amplifier; and
a second-stage amplifier, wherein the first-stage amplifier is coupled to the second-stage amplifier using the adjustable transformer, and a bandwidth of the adjustable transformer is adjustable in a manner that an operating frequency band of the radio frequency circuit is adjustable to cover a first frequency band and a second frequency band, and wherein the first frequency band and the second frequency band are different frequency bands but overlap with each other.

2. The radio frequency circuit according to claim 1, wherein the operating frequency band of the radio frequency circuit is further adjustable to cover the first frequency band and a third frequency band, wherein the first frequency band and the third frequency band are different frequency bands and do not overlap with each other.

3. The radio frequency circuit according to claim 1, wherein the adjustable transformer further comprises an adjustable switch, and the adjustable switch is configured to adjust a bandwidth of the operating frequency band of the radio frequency circuit.

4. The radio frequency circuit according to claim 1, wherein a Q value enhancement circuit that forms a loop with the at least one first coil is further disposed between the first node and the second node, and the Q value enhancement circuit is configured to increase a Q value of the adjustable transformer.

5. The radio frequency circuit according to claim 4, wherein the Q value enhancement circuit comprises a cross-coupling field effect transistor (FET) pair, and the cross-coupling FET pair is configured to provide negative resistance compensation for the at least one first coil.

6. The radio frequency circuit according to claim 5, wherein the Q value enhancement circuit further comprises a variable current source, and the variable current source is configured to provide a current to the cross-coupling FET pair.

7. The radio frequency circuit according to claim 1, wherein an adjustable device that forms a loop with the at least one first coil is disposed between the first node and the second node, and the adjustable device is a resistor or a switch.

8. The radio frequency circuit according to claim 7, wherein the switch is a transistor, and a gate voltage of the transistor is adjustable.

9. The radio frequency circuit according to claim 1, wherein in a layout of the adjustable transformer, the primary coil, the secondary coil, and the at least one first coil are disposed at a first wiring layer, and the primary coil and the secondary coil are disposed on an outer side of the at least one first coil.

10. The radio frequency circuit according to claim 1, wherein the at least one first coil comprises at least two first coils; and in a layout of the adjustable transformer, the at least two first coils are disposed at a same wiring layer, and the at least two first coils are symmetrically disposed.

11. The radio frequency circuit according to claim 1, wherein the adjustable transformer further comprises a tuning capacitor, a first end of the tuning capacitor is connected to a first end of at least one of the primary coil and a first end of the secondary coil, and a second end of the tuning capacitor is connected to a second end of at least one of the primary coil and a second end of the secondary coil.

12. The radio frequency circuit according to claim 1, wherein at least one of the first-stage amplifier or the second-stage amplifier is a differential amplifier.

13. The radio frequency circuit according to claim 12, wherein the differential amplifier comprises a plurality of common-source transistors.

14. The radio frequency circuit according to claim 13, wherein the differential amplifier further comprises degenerated inductors, the degenerated inductors are coupled to a common source terminal of the plurality of common-source transistors, and a center tap of the degenerated inductors is coupled to a ground terminal.

15. The radio frequency circuit according to claim 13, wherein the differential amplifier further comprises a plurality of neutralizing capacitors, a first neutralizing capacitor of the plurality of neutralizing capacitors is coupled to a drain of a first transistor of the plurality of common-source transistors and a gate of a second transistor of the plurality of common-source transistors, and a second neutralizing capacitor of the plurality of neutralizing capacitors is coupled to a gate of the first transistor and a drain of the second transistor.

16. An adjustable transformer, comprising:
- a primary coil;
- a secondary coil; and
- at least one first coil, wherein the primary coil and the secondary coil are magnetically coupled to each other, the at least one first coil is magnetically coupled to both the primary coil and the secondary coil, a first end of the first coil is coupled to a first node and a second end of the first coil is coupled to a second node, and an impedance between the first node and the second node is adjustable.

17. The adjustable transformer according to claim 16, wherein a Q value enhancement circuit that forms a loop with the first coil is further disposed between the first node and the second node, and the Q value enhancement circuit is configured to increase a Q value of the adjustable transformer.

18. The adjustable transformer according to claim 17, wherein the Q value enhancement circuit comprises a cross-coupling field effect transistor (FET) pair, configured to provide negative resistance compensation for the first coil.

19. The adjustable transformer according to claim 18, wherein the Q value enhancement circuit further comprises a variable current source, configured to provide a current for the cross-coupling FET pair.

20. The adjustable transformer according to claim 16, wherein an adjustable resistor or a switch that forms a loop with the first coil is disposed between the first node and the second node.

* * * * *